US010840892B1

(12) United States Patent
Rengarajan et al.

(10) Patent No.: US 10,840,892 B1
(45) Date of Patent: Nov. 17, 2020

(54) FULLY DIGITAL, STATIC, TRUE SINGLE-PHASE CLOCK (TSPC) FLIP-FLOP

(71) Applicant: MARVELL INTERNATIONAL LTD., Hamilton (BM)

(72) Inventors: Krishnan S. Rengarajan, Bangalore (IN); Alok Chandra, Bengaluru (IN); Chethan Ramanna, Manyata T&D (IN)

(73) Assignee: MARVELL ASIA PTE, LTD., Singapore (SG)

( * ) Notice: Subject to any disclaimer, the term of this patent is extended or adjusted under 35 U.S.C. 154(b) by 0 days.

(21) Appl. No.: 16/512,535

(22) Filed: Jul. 16, 2019

(51) Int. Cl.
*H03K 3/356* (2006.01)
*H03K 3/3562* (2006.01)
*H03K 3/012* (2006.01)

(52) U.S. Cl.
CPC ......... *H03K 3/35625* (2013.01); *H03K 3/012* (2013.01)

(58) Field of Classification Search
CPC ...... H03K 3/012; H03K 3/037; H03K 3/0372; H03K 3/0375; H03K 3/35625; H03K 3/356104; H03K 3/3562; H03K 3/35606; H03K 3/356121; H03K 3/281; H03K 3/286; H03K 3/288
See application file for complete search history.

(56) References Cited

U.S. PATENT DOCUMENTS

| | | | |
|---|---|---|---|
| 5,552,737 A | 9/1996 | Chen | |
| 6,348,825 B1 | 2/2002 | Galbi et al. | |
| 6,492,854 B1 | 12/2002 | Ku et al. | |
| 7,994,836 B2 * | 8/2011 | Hart | H03K 3/35625 327/208 |
| 8,880,965 B2 | 11/2014 | Zhang et al. | |
| 9,065,431 B2 * | 6/2015 | Kim | H03K 3/356008 |
| 9,742,382 B2 | 8/2017 | Cai et al. | |
| 9,985,613 B2 | 5/2018 | Savanth et al. | |

(Continued)

FOREIGN PATENT DOCUMENTS

WO 97/15116 A2 4/1997

OTHER PUBLICATIONS

Bharathi et al., "Design of Power Efficient 18-Transistor True Single-Phase Clocking Flip-Flop," International Journal of Trendy Research in Engineering and Technology (IJTRET), vol. 2, Issue 2(2), 2018, pp. 1-4.

(Continued)

*Primary Examiner* — Long Nguyen

(57) ABSTRACT

Disclosed is a flip-flop (FF) (e.g., a D-type flip-flop (DFF) or a scan flip-flop (SFF)). The FF is configured to reduce dynamic power consumption of an integrated circuit (IC) by employing only a single-phase of a clock signal. Specifically, the FF includes a primary latch and a secondary latch. Each of these latches includes a multi-stage input driver, which internally generates a control signal based on both the single-phase clock signal and an input signal and which also generates a stored bit signal based on the control signal. Each of these latches can also include a feedback path with an inverter that inverts the stored bit signal and a tri-state logic device that generates a feedback signal that is dependent on the inverted stored bit signal, the control signal and the clock signal. As a result, the FF is a fully digital, static, true single-phase clock (TSPC) flip-flop.

21 Claims, 5 Drawing Sheets

(56) References Cited

U.S. PATENT DOCUMENTS

| | | |
|---|---|---|
| 10,187,063 B1 | 1/2019 | Scantlin et al. |
| 2006/0176095 A1 | 8/2006 | Chan et al. |
| 2007/0146034 A1 | 6/2007 | Acharya |
| 2009/0300448 A1* | 12/2009 | Tomita ............ G01R 31/31854 714/731 |
| 2015/0116019 A1 | 4/2015 | Hsu et al. |
| 2015/0207494 A1 | 7/2015 | Kim |
| 2016/0065184 A1 | 3/2016 | Liu et al. |
| 2016/0094204 A1 | 3/2016 | Nandi et al. |
| 2018/0159513 A1 | 6/2018 | Reddy et al. |

OTHER PUBLICATIONS

James et al., "Reliability Enhancement of Low Power TSPC Flip Flop," International Journal of Engineering Research & Technology (IJERT), vol. 7, Issue 04, 2018, pp. 62-66.

Khan et al., "A Review of True Single Phase Clocking Based Digital Circuit Design," International Journal on Recent and Innovation Trends in Computing and Communication, vol. 6 Issue 11, 2018, pp. 10-13.

Kumar et al., "Comparative Analysis of D Flip-Flops in Terms of Delay and its Variability," IEEE, 2015, pp. 1-6.

Lin et al., "A Modified Static Contention Free Single Phase Clocked Flip-Flop Design for Low Power Applications," Journal of Semiconductor Technology and Science, vol. 18, No. 5, 2018, pp. 640-644.

Behzad Razavi, "A Circuit for All Seasons," IEEE Solid-State Circuits Magazine, 2016, pp. 10-13.

Sharma et al., "True Single Phase Clocking Based Flip-Flop Design Using Different Foundries," International Journal of Advances in Engineering & Technology, vol. 7, Issue 2, 2014, pp. 352-358.

Singh et al., "A High Performance Flip Flop for Low Power Low Voltage Systems," IEEE, World Congress on Information and Communication Technologies, 2011, pp. 257-262.

Yuan et al., "New TSPC Latches and Flipflops Minimizing Delay and Power," IEEE, Symposium on VLSI Circuits, 1996, pp. 160-161.

Rubil Ahmadi, "A Power Efficient Hold-Friendly Flip-Flop," IEEE, 2008, pp. 81-84.

Velammal et al., "High Speed and Low Power ASIC Using Threshold Logic," International Journal of Advanced Research in Basic Engineering Sciences and Technology (IJARBEST), vol. 2, Issue 11, 2016, pp. 24-31.

Naeini et al., "The Design and Implementation of a Low-Power Gating Scan Element in 32/28 nm CMOS Technology," Journal of Low Power Electronics and Applications, 2017, pp. 1-20.

Sayed et al., "A New Low Power High Performance Flip-Flop," Midwest Symposium on Circuits and Systems, MWSCAS, 2006, pp. 1-5.

Strollo et al., "New Clock-Gating Techniques for Low-Power Flip-Flops," ACM, 2000, pp. 114-119.

Wimer et al., "Design Flow for Flip-Flop Grouping in Data-Driven Clock Gating," IEEE Transactions on Very Large Scale Integration (VLSI) Systems, vol. 22, No. 4, 2014, pp. 771-778.

Priyanka et al., "Low Power 18-Transistor TSPC Flip Flop Design based on Logic Reduction Scheme", International Journal of Research, vol. 7, Issue XI, 2018, pp. 1888-1896.

Lin et al., Low-Power 19-Transistor True Single-Phase Clocking Flip-Flop Design Based on Logic Structure Reduction Schemes, IEEE Transactions on Very Large Scale Integration (VLSI) Systems, PP(99):1-12, 2017, pp. 1-12.

Teh et al., "A 77% energy-saving 22-transistor single-phase-clocking D-flip-flop with adaptive-coupling configuration in 40nm CMOS", IEEE, International Solid-State Circuits Conference, 2011, pp. 338-340.

* cited by examiner

| TRUTH TABLE | | | |
|---|---|---|---|
| SE | D | SI | X |
| 0 | 0 | 0 | 0 |
| 0 | 0 | 1 | 0 |
| 0 | 1 | 0 | 1 |
| 0 | 1 | 1 | 1 |
| 1 | 0 | 0 | 0 |
| 1 | 0 | 1 | 1 |
| 1 | 1 | 0 | 0 |
| 1 | 1 | 1 | 1 |

FULLY DIGITAL, STATIC, TRUE SINGLE-PHASE CLOCK (TSPC) FLIP-FLOP

BACKGROUND

Field of the Invention

The present invention relates to flip-flop (FF) structures and, particularly, to FF structures configured for reduced power consumption.

Description of Related Art

One key goal for integrated circuit (IC) structures, such as system-on-chip (SOC) structures, is power optimization and, particularly, reducing total power consumption. Components of total power consumption include both dynamic power consumption and leakage power consumption. While various different techniques for reducing either dynamic power consumption or leakage power consumption are known, often times the techniques that result in a reduction in dynamic power consumption will cause a corresponding increase in leakage power consumption or some other undesirable result (e.g., an increase area consumption or a decrease in performance) and vice versa. For example, an IC structure, such as a SOC structure, may include a large number of flip-flops (FFs) (e.g., D-type flip-flops (DFFs) or scan-in flip-flops (SFFs)). The currently used techniques for reducing dynamic power consumption associated with operation of such FFs include reducing the positive voltage (VDD) level supplied to the FFs and/or reducing the load on the clock tree that drives the FFs. Reducing the VDD level can result in FF performance degradation including, for example, slower switching speeds. To limit this performance degradation, the threshold voltage (VT) of transistors incorporated into each FF can be decreased. Unfortunately, decreasing the VT of the transistors can result in a corresponding increase in leakage power consumption. Furthermore, currently used techniques designed to reduce the load on the clock tree generally result in a corresponding decrease in performance, an increase in leakage current (i.e., an increase in leakage power consumption), and/or an increase in FF size (i.e., an increase in area consumption).

SUMMARY

Disclosed herein are embodiments of a flip-flop (FF), such as a D-type flip-flop (DFF) or a scan-in flip-flop (SFF). Each embodiment of the FF can include two latches: a primary latch; and a secondary latch connected to the primary latch. Each of the two latches (i.e., the primary latch and the secondary latch) can include a multi-stage input driver. A control stage of the multi-stage input driver can include multiple transistors connected in series and a control node at a junction between two transistors of the multiple transistors. Gates of the two transistors can receive an input signal and a single-phase clock signal such that a logic state of a control signal at the control node depends on the input signal and the clock signal. A storage stage of the multi-stage input driver can include two additional transistors connected in series and a storage node at a junction between the two additional transistors. A gate of at least one of the two additional transistors can receive the control signal such that a logic state of a stored bit signal at the storage node depends on the control signal. Each of the two latches (i.e., the primary latch and the secondary latch) can also include a feed forward path connected to the storage node and a feedback path with opposing ends connected to the feed forward path. The feedback path can include an inverter and a tri-state logic device connected in series between the opposing ends. The inverter can receive the stored bit signal from the feed forward path and can generate an inverted stored bit signal. The tri-state logic device can receive the inverted stored bit signal, the control signal and the clock signal and can generate a feedback signal at a feedback node based on the received signals. The feedback signal within a particular latch can prevent switching of the stored bit signal when the input driver to the latch is turned off.

For example, disclosed embodiments of a D-type flip-flop (DFF) can include a primary latch. The primary latch can include a first multi-stage input driver, a first feed forward path and a first feedback path. The first multi-stage input driver can include a first control stage and a first storage stage. The first control stage can include multiple first transistors connected in series and a first control node at a junction between two of the first transistors. Gates of at least two of the first transistors can receive an input signal and a clock signal, respectively, such that the logic state of a first control signal at the first control node depends on the input signal and the clock signal. The first storage stage can include two additional first transistors connected in series and a first storage node at a junction between the two additional first transistors. The gates of these two additional first transistors can receive the first control signal such that the logic state of a first stored bit signal at the first storage node depends on the first control signal.

The first feed forward path can be connected to the first storage node and the first feedback path can have first opposing ends connected to the first feed forward path. The first feedback path can further include a first inverter with a first intermediate node and a first tri-state logic device with a first feedback node. The first inverter can receive the first stored bit signal from the first feed forward path and can generate an inverted first stored bit signal at the first intermediate node. The first tri-state logic device can receive the inverted first stored bit signal, the first control signal and the clock signal and can generate a first feedback signal at the first feedback node based on these received signals. The DFF can further include a secondary latch and a digital output driver. The secondary latch and the primary latch can have similar, but not identical configurations (as discussed in greater detail in the detailed description section of this specification). Specifically, the secondary latch can include: second multi-stage input driver, which is connected to both the first feed forward path and the first feedback path of the primary latch; a second feed forward path; and a second feedback path. The DFF can further include a digital output driver connected to the second feed forward path of the secondary latch.

Disclosed embodiments of a scan flip-flop (SFF) can include a primary latch. The primary latch can include at least one first multi-stage input driver, a first feed forward path and a first feedback path.

In one embodiment of the SFF, the primary latch can include a single first multi-stage input driver connected to the first feed forward path. This single first multi-stage input driver can have an initial stage and, particularly, a multiplexor that provides an input signal, which is a selected one of either a data input signal or a scan-in input signal depending upon the operating mode of the SFF (i.e., depending upon whether the DFF is operating in a normal operating mode or a test mode, respectively). The first multi-stage input driver can further include two follow-on stages: a first control stage and a first storage stage. As in the embodiment described above, the first control stage can include multiple first transistors connected in series and a first control node at a junction between two of the first transistors. Gates of at least two of the first transistors can receive an input signal and a clock signal, respectively, such that the logic state of a first control signal at the first control node depends on the input signal and the clock signal. The first storage stage can include two additional first transistors connected in series and a first storage node at a junction between the two additional first transistors. The gates of these two additional first transistors can receive the first control signal such that the logic state of a first stored bit signal at the first storage node depends on the first control signal. The first feed forward path can be connected to the first storage node such that this first stored bit signal is transmitted along the first feed forward path.

In another embodiment of the SFF, the primary latch can include two essentially identical parallel and alternatively operable first multi-stage input drivers (instead of a single multi-stage input driver with a multiplexor). The two first multi-stage input drivers can include one first multi-stage input driver, which processes a data input signal and which can be selectively enabled (e.g., when a scan enable signal has a low logic state and an inverted scan enable signal has a high logic state) and another first multi-stage input driver, which processes a scan-in input signal and which can be selectively enabled (e.g., when the scan enable signal has the high logic state and the inverted scan enable signal has low logic state). Each of these first multi-stage input drivers can include a first control stage and a first storage stage, as described above. The first storage node of each of the two first multi-stage input drivers can be connected in parallel to the first feed forward path such that the first stored bit signal (from whichever of the two first multi-stage input drivers is selectively enabled) is transmitted along the first feed forward path.

In each of the embodiments of the SFF mentioned above, the first feedback path can have first opposing ends connected to the first feed forward path. The first feedback path can further include a first inverter with a first intermediate node and a first tri-state logic device with a first feedback node. The first inverter can receive the first stored bit signal from the first feed forward path and can generate an inverted first stored bit signal at the first intermediate node. The first tri-state logic device can receive the inverted first stored bit signal, the clock signal and the first control signal and can generate a first feedback signal at the first feedback node based on these received signals. The SFF can further include a secondary latch and a digital output driver. The secondary latch and the primary latch can have similar, but not identical configurations (as discussed in greater detail in the detailed description section of this specification). Specifically, the secondary latch can include: a single second multi-stage input driver, which is connected to both the first feed forward path and the first feedback path of the primary latch; a second feed forward path; and a second feedback path. The SFF can further include a digital output driver connected to the second feed forward path of the secondary latch.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, an integrated circuit (IC) structure, such as a system-on-chip (SOC) structure, may include a large number of flip-flops (FFs) (e.g., D-type flip-flops (DFFs) or scan-in flip-flops (SFFs)).

Figure 1:
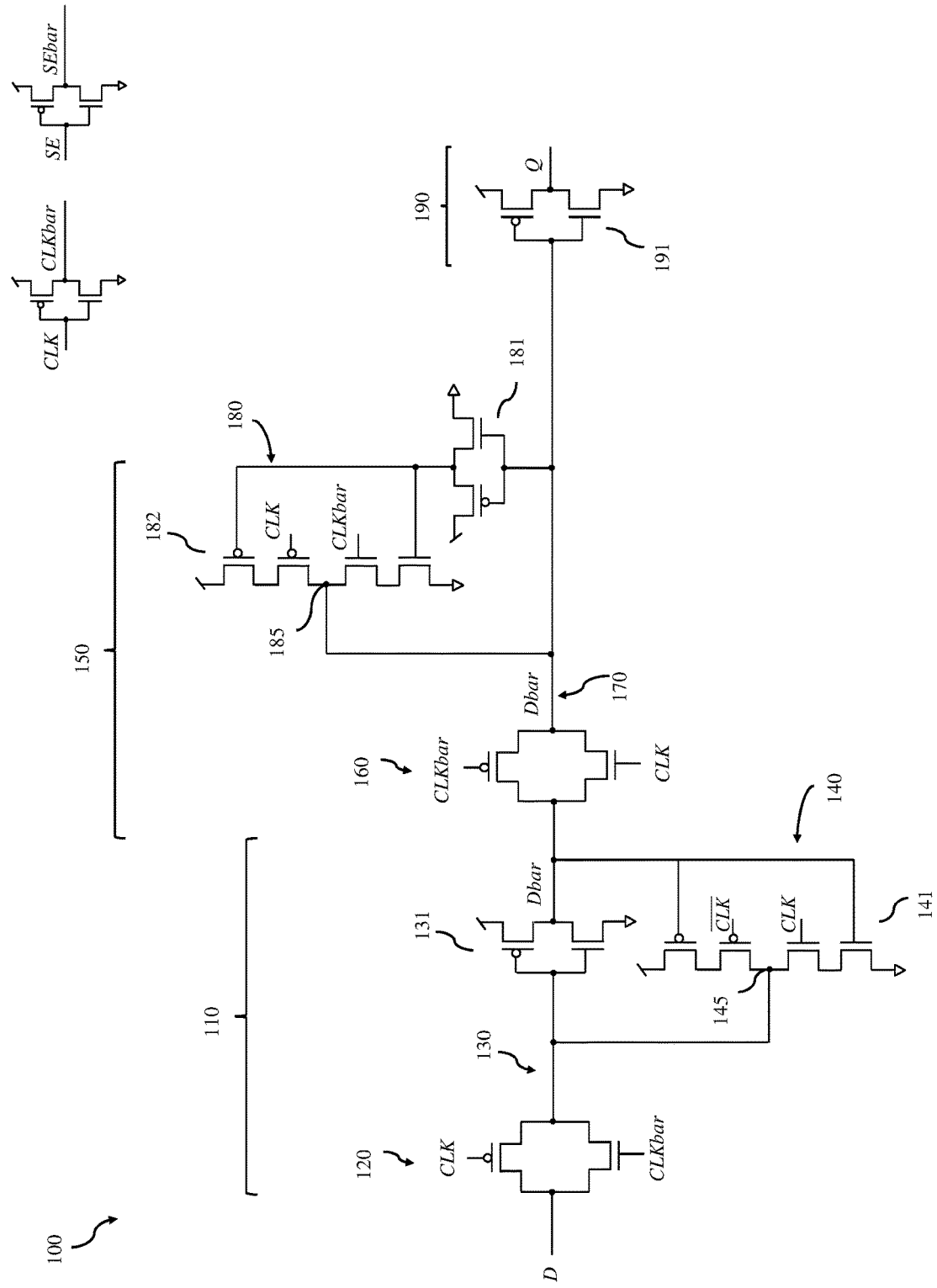
FIG. 1 is a schematic diagram illustrating an exemplary D-type flip-flop (SFF)

FIG. 1 is a schematic diagram illustrating an exemplary DFF 100, which includes includes a primary latch 110, a secondary latch 150, and a digital output driver 190. In this exemplary DFF 100, the primary latch 110 includes: an input driver 120 (e.g., a transmission gate with a p-type field effect transistor (PFET) and an n-type field effect transistor (NFET) controlled by a clock signal (CLK) and an inverted clock signal (CLKbar), respectively); a feed forward path 130 including an inverter 131; and a feedback path 140 including a tri-state logic device 141 having two PFETs controlled by the logic state of the output of the inverter 131 and CLKbar, respectively, connected in series with two NFETs controlled by CLK and the logic state of the output of the inverter 131, respectively. In this exemplary DFF 100, the secondary latch 150 includes: an input driver 160 (e.g., a transmission gate with a PFET and an NFET controlled by CLKbar and CLK, respectively); a feed forward path 170; and a feedback path 180 including an inverter 181 and a tri-state logic device 182 having two PFETs controlled by the logic state of the output of the inverter 181 and CLK, respectively, connected in series with two NFETs controlled by CLKbar and the logic state of the output of the inverter 181, respectively. In this exemplary DFF 100, the digital output driver 190 can include yet another inverter 191.

In operation, when CLK switches to a low logic state (i.e., a low voltage level) such that CLKbar switches to a high logic state (i.e., a high voltage level), the input driver 120 of the primary latch 110 turns on and the input driver 160 of the secondary latch 150 turns off. Thus, the primary latch 110 becomes transparent, receiving the data input signal (D) (i.e., the data input signal (D) is clocked into the primary latch 110). The data input signal (D) is transmitted along the feed forward path 130 and is inverted by the inverter 131 into an inverted data input signal (Dbar). This inverted data input signal (Dbar) is applied to the input driver 160 of the secondary latch 150 (which is turned off, thereby preventing the Dbar from being clocked into the secondary latch 150). This inverted data input signal (Dbar) is also applied to the tri-state logic device 141 in the feedback path 140 of the primary latch 110. At this point in the operation, if the data input signal (D) has a low logic state such that the inverted data input signal (Dbar) has a high logic state, the top PFET in the tri-state logic device 141 would turn off and the bottom NFET in the tri-state logic device 141 would turn on. Alternatively, if the data input signal (D) has the high logic state such that the inverted data input signal (Dbar) has the low logic state, the top PFET in the tri-state logic device 141 would turn on and the bottom NFET in the tri-state logic device 141 would be turn off. However, because the CLK currently has the low logic state and CLKbar currently has the high logic state, the center PFET and the center NFET will both be off, the tri-state logic device 141 will have a high impedance output at the feedback node 145, and there will be no impact on the voltage level on the feed forward path 130 between the input driver 120 and the inverter 131.

When CLK switches to the high logic state and CLKbar switches to the low logic state, the input driver 120 of the primary latch 110 turns off, thereby preventing any new data from being clocked into the primary latch 110. Additionally, switching of CLK and CLKbar causes the center FETs in the tri-state logic device 141 to turn on, thereby allowing the voltage level on the feed forward path 130 between the input driver 120 and the inverter 131 to be pulled high or low through the feedback node 145, depending upon the logic state of the inverted data input signal (Dbar). That is, if Dbar has the high logic state, then the top PFET will be off and the bottom NFET will be on, thereby pulling down the voltage level on the feedback node 145 and ensuring that the voltage level on the feed forward path 130 between the input driver 120 and the inverter 131 remains low. However, if Dbar has the low logic state, the top PFET will be on and the bottom NFET will be off, thereby pulling up the voltage level on the feedback node 145 and ensuring that the voltage level on the feed forward path 130 between the input driver 120 and the inverter 131 remains high. As a result, when the input driver 120 for the primary latch 110 is off, the current logic state on the feed forward path 130 will remain unchanged (i.e., static or stable) regardless of whether or not the data input signal (D) switches states.

Additionally, when CLK switches to the high logic state and CLKbar switches to the low logic state, the input driver 160 of the secondary latch 150 turns on and the secondary latch 150 becomes transparent, receiving the inverted data input signal (Dbar) from the primary latch 110 (i.e., the inverted data input signal (Dbar) is clocked into the secondary latch 150). The inverted data input signal (Dbar) is transmitted along the feed forward path 170 and is received by the digital output driver 190 (i.e., the inverter 191) and is inverted such that the digital output signal (Q) from the digital output driver 190 reflects the logic state of the currently stored data in the primary latch 110. The inverted data input signal (Dbar) is also applied to the feedback path 180 of the secondary latch 150. In the feedback path 180, the inverted data input signal (Dbar) is inverted back by the inverter 181 such that the signal applied to the tri-state logic device 182 also corresponds the logic state of the currently stored data in the primary latch 110. At this point in the operation, if the currently stored data in the primary latch 110 has the logic state such that Dbar has the high logic state and the output of the inverter 181 has the low logic state, the top PFET in the tri-state logic device 182 would be turned on and the bottom NFET in the tri-state logic device 182 would be turned off. Alternatively, if the currently stored data in the primary latch 110 has the high logic state such that Dbar has the low logic state and the output of the inverter 181 has the high logic state, the top PFET in the tri-state logic device 182 would be turned off and the distal NFET in the tri-state logic device 182 would be turned on. However, because CLK has the high logic state and CLKbar has the low logic state, the center FETs will both be off, the tri-state logic device 182 will have a high impedance output at feedback node 185, and there will be no impact on the voltage level on the feed forward path 170 between the input driver 160 and the digital output driver 190.

When CLK switches back to the low logic state and CLKbar switches back to the high logic state, the input driver 160 of the secondary latch 150 again turns off. Switching of CLK and CLKbar causes the center FETs in the tri-state logic device 182 to turn on, thereby allowing the voltage level on the feed forward path 170 to be pulled high or low through the feedback node 185, depending upon the logic state of the output of the inverter 181. That is, if Dbar is low, then the output of the inverter 181 will be high, the top PFET in the tri-state logic device 182 will be turned off and the bottom NFET will be turned on, thereby pulling down the voltage level on feedback node 185 and ensuring that the voltage level on the feed forward path 170 remains low. However, if Dbar is high, then the output of the inverter 181 will be low, the bottom NFET will be turned off, and the top PFET will be turned on, thereby pulling up the voltage level on the feedback node 185 and ensuring that the voltage level on the feed forward path 170 remains high. As a result, when the input driver 160 for the secondary latch 150 is off, the current logic state of the digital output (Q) will remain unchanged (i.e., static or stable) regardless of whether or not the stored data within the primary latch changes logic states.

Those skilled in the art will recognize that such a DFF can be easily converted into a SFF by incorporating a multiplexor into the input driver 120 of the primary latch 110. During normal operation, the multiplexor can selectively apply the data input signal (D) to the transmission gate. However, during system test, a scan enable signal controlling the multiplexor can cause a scan-in input signal (SI) to be selectively applied to the transmission gate.

In any case, such a DFF 100 (or SFF) may perform as desired. However, the relatively high number of CLK and CLKbar nodes, each of which requires a separate input clock pin, can result in a relatively high load on the clock tree of an IC and can, thereby, result in a relatively high amount of dynamic power consumption by the IC. Techniques for reducing the high dynamic power consumption caused by DFFs, such as that shown in FIG. 1, or by SFFs typically include reducing the positive voltage (VDD) level supplied to the FFs and/or reducing the load on the clock tree that drives the FFs. Reducing the VDD level can result in FF performance degradation including, for example, slower switching speeds. To limit this performance degradation, the threshold voltage (VT) of transistors incorporated into each FF can be decreased. Unfortunately, decreasing the transistor VT generally results in a corresponding increase in leakage current (i.e., an increase in leakage power consumption). Furthermore, currently available techniques designed to reduce the load on the clock tree generally result in a corresponding decrease in performance, an increase in leakage power consumption, and/or an increase in FF size (i.e., an increase in area consumption). Thus, there is a need in the art for FF structures that allow for the reduction of the VDD level and/or the reduction of the load on the clock tree in order to reduce dynamic power consumption while also minimizing any significant corresponding decrease in performance, increase in leakage power consumption, and/or increase in FF size.

In view of the foregoing, disclosed herein are embodiments of a flip-flop (FF), such as a D-type flip-flop (DFF) or a scan flip-flop (SFF). Each of the FF embodiments can include a primary latch and a secondary latch. Both the primary latch and the secondary latch can include a multistage input driver, which internally generates a control signal based on a single-phase clock signal and an input signal and which further generates a stored bit signal based on the control signal. Additionally, both the primary latch and the secondary latch can include a feedback path with an inverter, which inverts the stored bit signal, and a tri-state logic device, which generates a feedback signal that is dependent on the inverted stored bit signal, the control signal and the clock signal. No inverted clock signal is employed. As a result of this configuration, each FF embodiment disclosed herein is a fully digital, static, true single-phase clock (TSPC) flip-flop. By employing only a single-phase clock signal, the load on a clock tree of an integrated circuit (IC) (e.g., a system on chip (SOC)) that incorporates a large number of such FFs is significantly reduced and, thus, so is the dynamic power consumption of the IC. This reduction in dynamic power consumption occurs without significantly decreasing performance, increasing leakage power consumption, or increasing the FF size.

Figure 2:
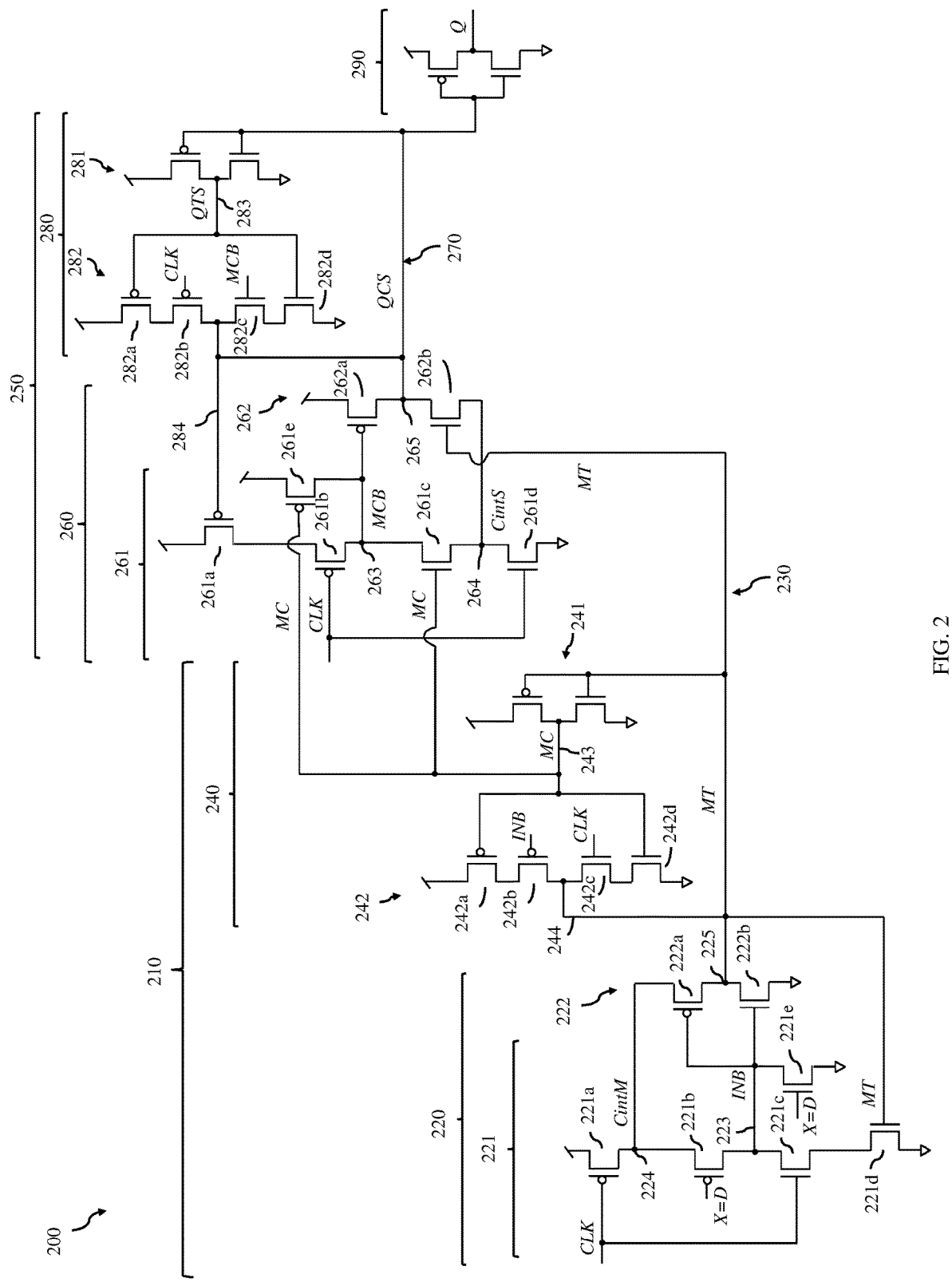
FIG. 2 is a schematic diagram illustrating an embodiment of fully digital, static, true single-phase clock (TSPC) D-type flip-flop (DFF)
Figure 3:
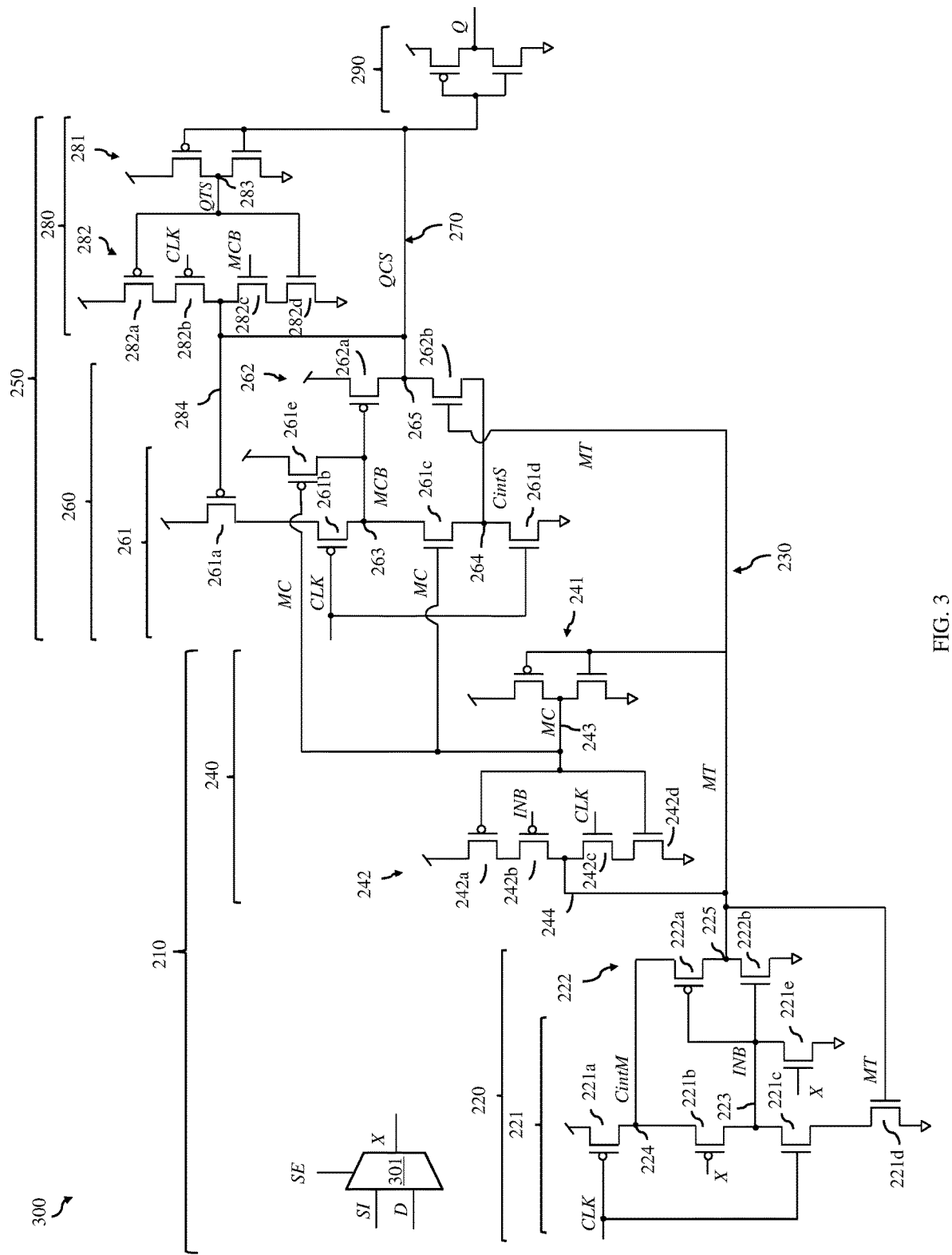
FIG. 3 is a schematic diagram illustrating an embodiment of fully digital, static, true single-phase clock (TSPC) scan flip-flop (SFF)
Figure 5:
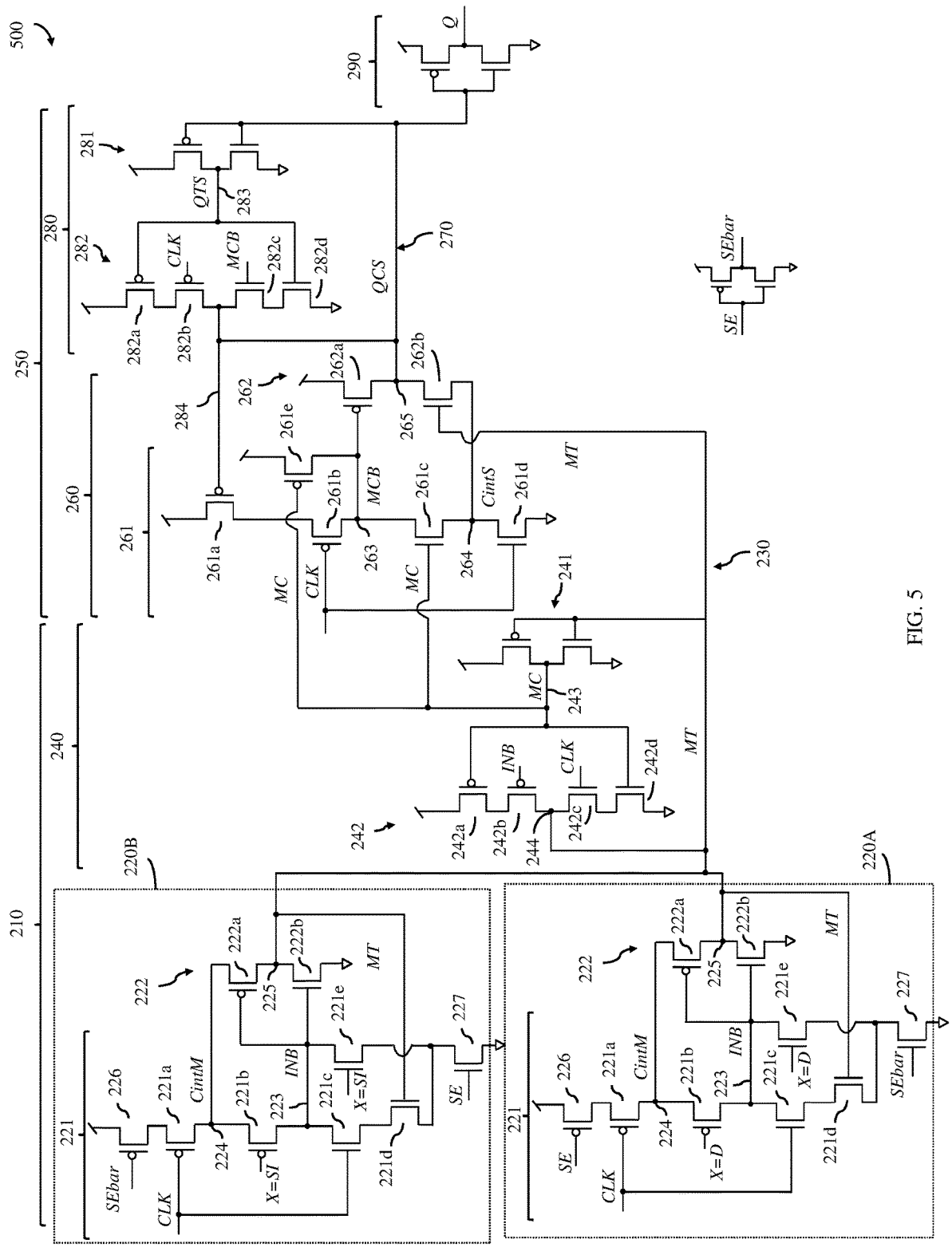
FIG. 5 is a schematic diagram illustrating another embodiment of a fully digital, static, true, single-phase clock (TSPC) scan flip-flop (SFF).

Generally, disclosed herein are embodiments of a flip-flop (FF), such as a D-type flip-flop (DFF) 200, as shown in FIG. 2, or a scan flip-flop 300 or 500, as shown in FIGS. 3 and 5, respectively. Each FF 200, 300, 500 can include: a primary latch 210; a secondary latch 250 connected to the primary latch 210; and a digital output driver 290 connected to the secondary latch 250.

The primary and secondary latches 210, 250 can each include at least one multi-stage input driver. In the DFF 200 of FIG. 2 and the SFF 300 of FIG. 3, the primary latch 210 can include a single first multi-stage input driver 220. In the SFF 500 of FIG. 5, the primary latch 210 can include two parallel and alternatively operable first multi-stage input drivers 220A and 220B. In the DFF 200, the SFF 300, and the SFF 500, the secondary latch 250 can include a single second multi-stage input driver 260.

The multi-stage input drivers 220, 260 can have a control stage 221, 261 configured to receive a single-phase clock signal (CLK) and an input signal.

In the primary latch 210, the first multi-stage input driver(s) can have a first control stage 221 configured to receive a single-phase clock signal (CLK) and an input signal (X). In the DFF 200 of FIG. 2, the input signal (X) can be a data input signal (D). In the SFF 300 of FIG. 3, the input signal (X) can be a multiplexor-selected one of either a data input signal (D) (e.g., during normal mode operation) or a scan-in input signal (SI) (during test mode operation). In the SFF 500 of FIG. 5, the input signal (X) to the different first multi-stage input drivers 220A and 220B differs. For the first multi-stage input driver 220A, the input signal (X) can be a data input signal (D) and the first multi-stage input driver 220A can be selectively enabled for normal mode operation. For the first multi-stage input driver 220B, the input signal (X) can be a scan-in input signal (SI) and the first multi-stage input driver 220B can be selectively enabled for test mode operation. In the secondary latch 250, the second multi-stage input driver 260 can have a second control stage 261 configured to receive the same single-phase clock signal (CLK) and a different input signal (MC), which, as discussed in greater detail below, can be internally generated in a feedback path of the primary latch 210.

In any case, the control stage 221, 261 can further include a control node 223, 263. A control signal (INB), (MCB) can be internally generated at the control node 223, 263 of the control stage 221, 261 based on the single-phase clock signal (CLK) and the input signal (X), (MC). Specifically, a control signal (INB), (MCB) can be internally generated at the control node 223, 263 of the control stage 221, 261 of the multi-stage input driver 220, 260 and generation of this control signal (INB), (MCB) can be gated by the clock signal (CLK) and the input signal (X), (MC). The multi-stage input driver 220, 260 can further include a storage stage 222, 262 that receives the control signal (INB), (MCB). The storage stage 222, 262 can further include a storage node 225, 265. A stored bit signal (MT), (QCS) can be internally generated at the storage node 225, 265 of the storage stage 222, 262 based at least on the control signal (INB), (MCB). Specifically, a stored bit signal (MT) can be internally generated at the storage node 225 by the storage stage 222 and generation of this stored bit signal (MT) can be gated by the control signal (INB). Similarly, a stored bit signal (QCS) can be internally generated at the storage node 265 by the storage stage 262 and generation of this stored bit signal (QCS) can be gated by the control signal (MCB) and also the stored bit signal (MT) on the storage node 225.

The primary and secondary latches 210, 250 can also each include a feed forward path 230, 270 and a feedback path 240, 280. The feed forward path 230, 270 can be connected to the storage node 225, 265. The feedback path 240, 280 can have opposing ends connected to discrete nodes on the feed forward path 230, 270. Furthermore, in each of the latches 210, 250, the feedback path 240, 280 can include an inverter 241, 281 and a tri-state logic device 242, 282 connected in series between the opposing ends of that feedback path. The inverter 241, 281 can receive the stored bit signal (MT), (QCS) from the feed forward path 230, 270 and can generate an inverted stored bit signal (MC), (QTS). It should be noted that the inverted stored bit signal (MC) output by the inverter 241 in the feedback path 240 of the primary latch 210 is the input signal employed in the control stage 261 of the multi-stage input driver 260 of the secondary latch 250, discussed above. The tri-state logic device 242, 282 can receive the inverted stored bit signal (MC), (QCS) from the inverter 241, 281, the control signal (INB), (MCB) from the control stage 221, 261 of the multi-stage input driver 220, 260, and the clock signal (CLK) and can further generate a feedback signal at a feedback node 244, 284 based on the received signals.

The digital output driver 290 can be connected to the feed forward path 270 of the secondary latch 250. This digital output driver 290 can further be configured so that a digital output signal (Q) output by the digital output driver 290 tracks the logic state of the input signal (X) that was initially stored in the primary latch 210 as stored bit signal (MT).

More specifically, as mentioned above, disclosed herein are FF embodiments including a DFF 200 (as shown in FIG. 2), an SFF 300 (as shown in FIG. 3), and another SFF 500 (as shown in FIG. 5). Each FF 200, 300 and 500 can include a primary latch 210, a secondary latch 250 and a digital output driver 290.

The primary latch 210 can include at least one first multi-stage input driver, a first feed forward path 230 connected to the first multi-stage input driver(s), and a first feedback path 240 connected to the first feed forward path 230.

The first multi-stage input driver(s) can each include at least a first control stage 221, which internally generates a first control signal (INB) on a first control node 223 based on a single-phase clock signal (CLK) and a first input signal (X), and a first storage stage 222, which internally generates a first stored bit signal (MT) on a first storage node 225, based on the first control signal (INB).

In the DFF 200 of FIG. 1, the primary latch 210 can include a single first multi-stage input driver 220 and the first input signal (X) can be a data input signal (D) applied directly to the first control stage 221.

In the SFF 300 of FIG. 3, the primary latch 210 can similarly include a single first multi-stage input driver 220. In this case, the first multi-stage input driver 220 can further include a preliminary stage and, particularly, a multiplexor 301. The multiplexor 301 can receive, as inputs, a data input signal (D) and a scan-in input signal (SE). The multiplexor 301 can further be controlled by a scan enable signal (SE). Thus, for example, when the scan enable signal (SE) has a low logic state indicating a normal operating mode, the multiplexor 301 can selectively apply the data input signal (D) as the input signal (X) to the first control stage 221; whereas, when the scan enable signal (SE) has a high logic state indicating a test mode, the multiplexor 301 can selectively apply the scan-in input signal (SI) as the input signal (X) to the first control stage 221.

Figures 4A, 4B:
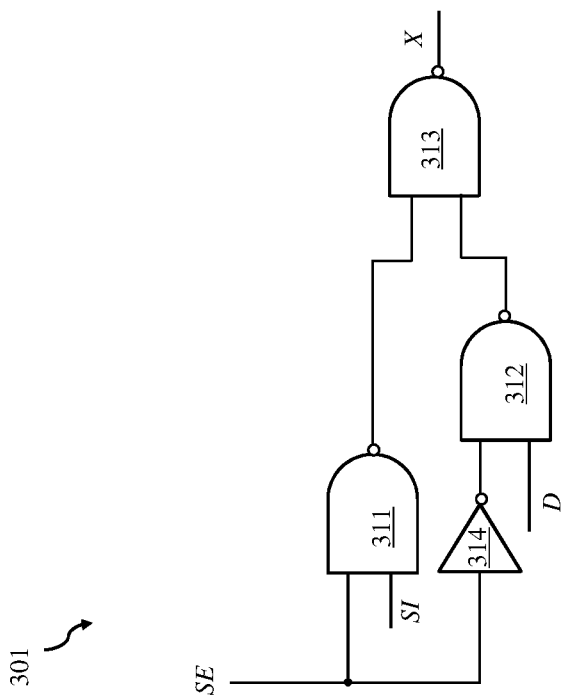
FIG. 4A is a schematic diagram illustrating an exemplary multiplexor (MUX) that can be incorporated into the SFF of FIG. 3.
FIG. 4B is a truth table for the MUX of FIG. 4A.

FIG. 4A is a schematic drawing illustrating an exemplary multiplexor 301 that can be incorporated into the SFF 300 of FIG. 3 and FIG. 4B is a truth table illustrating the logic state of the output signal (X) as a function of the logic states of the scan enable signal (SE), the data input signal (D) and the scan-in input signal (SI). As illustrated, this exemplary multiplexor 301 includes three NAND gates 311-313 and an inverter 314. In operation, the NAND gate 311 receives, as inputs, the scan enable signal (SE) and the scan-in input signal (SI). The inverter 314 receives, as an input, the scan enable signal (SE). The NAND gate 312 receives, as inputs, the output of the inverter 314 and the data input signal (D). The NAND gate 313 receives, as inputs, the outputs of the NAND gates 311-312. Those skilled in the art will recognize that the output of a NAND gate will have a low logic state only when both of the inputs have high logic states. Thus, given the configuration of the NAND gates 311-313 and the inverter 314 shown in FIG. 4A and described above, the truth table of FIG. 4B applies for the final output of the multiplexor 301 (i.e., the input signal (X)). Specifically, whenever the scan enable signal (SE) has the low logic state, the input signal (X) will have the same logic state as the data input signal (D) and whenever the scan enable signal (SE) has the high logic state, the input signal (X) will have the same logic state as the scan-in input signal (SI).

In the SFF 500 of FIG. 5, instead of a single first multi-stage input driver, the primary latch 210 can include two alternatively operable essentially identical first multi-stage input drivers 220A and 220B. These first multi-stage input drivers 220A and 220B can be connected in parallel to the first feed forward path 230. Each of these first multi-stage input drivers 220A and 220B can include a header device 226 (e.g., a p-type field effect transistor (PFET) header) and a footer device 227 (e.g., an n-type field effect transistor (NFET) footer) that allow the different first multi-stage input drivers to be selectively and alternatively enabled. For example, the first multi-stage input driver 220A can be selectively enabled for processing a data input signal (D) during a normal operating mode (i.e., the input signal (X) for this first multi-stage input driver 220A is the data input signal (D)). The first multi-stage input driver 220B can be selectively enabled for processing a scan-in input signal (SI) during a test mode (i.e., the input signal (X) for this first multi-stage input driver 220B is the scan-in input signal (SI)). It should be noted that, in the input driver 220A, the PFET header 226 can be controlled by a scan enable signal (SE) and the NFET footer 227 can be controlled by an inverted scan enable signal (SEbar); whereas, in the input driver 220B, the PFET header 226 can be controlled by the inverted scan enable signal (SEbar) and the NFET footer 227 can be controlled by the scan enable signal (SE). Thus, when the scan enable signal (SE) has the low logic state and the inverted scan enable signal (SEbar) has the high logic state, the first multi-stage input driver 220A will be enabled and the first multi-stage input driver 220B will be disabled and vice versa. In any case, each of the two first multi-stage input drivers 220A and 220B can include a first control stage 221 and, when the input driver is enabled, a first control signal (INB) can be generated in the first control stage 221 on a first control node 223 based on a single-phase clock signal (CLK) and the input signal (X) (i.e., based on D in the input driver 220A or based on SI in the input driver 220B). Each of the two first multi-stage input drivers 220A and 220B can also include a first storage stage 222 and, when the input driver is enabled, a first stored bit signal (MT) can be internally generated on a first storage node 225 in the first storage stage 222, based on the first control signal (INB).

In any case, the first control stage 221 of the first multi-stage input driver(s) can include multiple first transistors 221a-221d connected in series and, specifically, two p-type field effect transistors (PFETs) 221a-221b and two n-type field effect transistors (NFETs) 221c-221d connected in series between a positive voltage rail and ground. This stage 221 can further include the first control node 223 at the junction between the two PFETs 221a-221b and the two NFETs 221c-221d and also a pull-up node 224 at the junction between each of the two PFETs (i.e., at the junction between the PFET 221a and the PFET 221b). This stage 221 of the first multi-stage input driver 220 can further include a pull-down transistor 221e (i.e., another NFET), which is connected in series between the first control node 223 and ground. As illustrated, the gates of the two PFETs 221a and 221b can receive (i.e., can be controlled by) the single-phase clock signal (CLK) and the input signal (X), respectively. The gates of the two NFETs 221c and 221d can receive (i.e., can be controlled by) the same single-phase clock signal (CLK) and a first stored bit signal (MT) (which as discussed in greater detail below is fed back to the gate of the NFET 221d from the first feed forward path 230), respectively. Finally, the gate of the pull-down transistor 221e can also receive (i.e., can be controlled by) the input signal (X).

With this configuration, the first control signal (INB) will be internally generated on the first control node 223 and this first control signal (INB) will specifically be gated by the clock signal (CLK) and the input signal (X). That is, the voltage level on the first control node 223 and, thereby the logic state of the first control signal (INB) will vary as a function of the logic state of the clock signal (CLK), which is applied to the gates of the PFET 221a and the NFET 221c, and further as a function of the logic state of the input signal (X), which is applied to the gates of the PFET 221b and the pull-down transistor 221e.

The first storage stage 222 of the first multi-stage input driver(s) can include two additional first transistors 222a-222b connected in series and, particularly, an additional PFET 222a and an additional NFET 222b connected in series between the pull-up node 224 (which, as discussed above, is at the junction between the PFETs 221a and 221b) and ground. This first storage stage 222 can further include the first storage node 225 at the junction between the additional PFET 222a and the additional NFET 222b. The gates of the additional PFET 222a and the additional NFET 222b can receive (i.e., can be controlled by) the first control signal (INB).

With this configuration, the first stored bit signal (MT) will be internally generated on the first storage node 225 and this first stored bit signal (MT) will be directly gated by the first control signal (INB) and indirectly gated by the clock signal (CLK). That is, the logic state of the first stored bit signal (MT) will vary as a function of the logic state of the first control signal (INB), which is applied to the gates of the additional PFET 222a and the additional NFET 222b, and further as a function of the logic state of the clock signal (CLK), which is applied to the gate of the PFET 221*a* in the first control stage 221 to enable/disable pulling up of the voltage level on the pull-up node 224 and thereby to enable/disable pulling up of the voltage level on the first storage node 225.

The first feed forward path 230 can be connected to the first storage node 225 such that the first stored bit signal (MT) is transmitted along the first feed forward path 230. It should be noted that in the case of the SFF 500 shown in FIG. 5, the first feed forward path 230 can be connected to the first storage node of the first multi-stage input driver 220A and to the first storage node of the first multi-stage input driver 220B such that the input drivers 220A and 220B are connected in parallel to the first feed forward path 230.

The first feedback path 240 can have first opposing ends connected to the first feed forward path 230. The first feedback path 240 can include a first inverter 241, which has an input node and a first intermediate node 243, and a first tri-state logic device 242, which has multiple input nodes and a first feedback node 244. Specifically, the first inverter 241 can receive the first stored bit signal (MT) from the first feed forward path 230 at its' input node and, in response, can generate an inverted first stored bit signal (MC) at its' first intermediate node 243. The first tri-state logic device 242 can include the first feedback node 244, two PFETs (referred to herein as a distal or top PFET 242*a* and a proximal or center PFET 242*b*), which are connected in series between a positive voltage rail and the first feedback node 244, and two NFETs (referred to herein as a proximal or center NFET 242*c* and a distal or bottom NFET 242*d*), which are connected in series between the first feedback node 244 and ground. The gates of the distal PFET 242*a* and the distal NFET 242*d* can receive (i.e., can be controlled by) the inverted first stored bit signal (MC) from the first inverter 241. The gate of the proximal PFET 242*b* can receive (i.e., can be controlled by) the first control signal (INB) from the first control stage 221 of the first multi-stage input driver and the gate of the proximal NFET 242*c* can receive (i.e., can be controlled by) the single-phase clock signal (CLK).

It should be understood that in the SFF 500 additional wiring (not shown) must be included to ensure that corresponding first control signal (INB) from the selectively enabled first multi-stage input driver (i.e., 220A or 220B) is applied to the gate of the proximal PFET 242*b*. Additionally, it should be understood that in the discussion of the FETs within this first tri-state logic device 242, the terms "proximal" and "distal" are relative to the first feedback node 244.

The secondary latch 250 can be connected to the primary latch 210. Specifically, the secondary latch 250 can include a single second multi-stage input driver 260. The second multi-stage input driver 260 can be configured similar to the first multi-stage input driver. Specifically, the second multi-stage input driver 260 can include a second control stage 261, which internally generates a second control signal (MCB) on a second control node 263 based on the single-phase clock signal (CLK) and a second input signal (MC) (which as discussed above is internally generated at the first intermediate node 243 of the first inverter 241 in the first feedback path 240 of the primary latch 210) and a second storage stage 262, which internally generates a second stored bit signal (QCS) on a second storage node 265, based on the second control signal (MCB) and also based on the first stored bit signal (MT), which as discussed above is internally generated at the first storage node 225 of the first multi-stage input driver and transmitted along the first feed forward path 230 of the primary latch 210.

The second control stage 261 of the second multi-stage input driver 260 can include multiple second transistors 261*a*-261*d* connected in series and, particularly, two PFETs 261*a*-261*b* and two NFETs 261*c*-261*d* connected in series between the positive voltage rail and ground. This second control stage 261 of the second multi-stage input driver 260 can further include the second control node 263, which is at the junction between the two PFETs 221*a*-221*b* and the two NFETs 221*c*-221*d*, and a pull-down node 264, which is at the junction between each of the two NFETs (i.e., at the junction between the NFET 261*c* and the NFET 261*d*). This second control stage 261 of the second multi-stage input driver 260 can further include a pull-up transistor 261*e* (i.e., another PFET) connected in series between the positive voltage rail and the second control node 263. As illustrated, the gate of the PFETs 261*a* in the second control stage 261 can receive (i.e., can be controlled by) a second feedback signal (discussed in greater detail below). The gates of the PFET 261*b* and the NFET 261*d* can receive (i.e., can be controlled by) the single-phase clock signal (CLK). The gate of the NFET 261*c* can receive (i.e., can be controlled by) an input signal and, particularly, the inverted first stored bit signal (MC) (which is discussed above is internally generated in the first feedback path 240 of the primary latch), respectively. Finally, the gate of the pull-up transistor 261*e* can also receive (i.e., can be controlled by) the inverted first stored bit signal (MC).

With this configuration, a second control signal (MCB) will be internally generated on the second control node 263 and this second control signal (MCB) will be gated by the clock signal (CLK) and the inverted first stored bit signal (MC). That is, the voltage level on the second control node 263 and, thereby the logic state of the second control signal (MCB) will vary as a function of the logic state of the clock signal (CLK), which is applied to the gates of the PFET 261*b* and the NFET 261*d*, and further as a function of the logic state of the inverted first stored bit signal (MC), which is applied to the gates of the NFET 261*c* and the pull-up transistor 261*e*.

The second storage stage 262 of the second multi-stage input driver 260 can include two additional second transistors 262*a*-262*b* connected in series and, particularly, an additional PFET 262*a* and an additional NFET 262*b* connected in series between the positive voltage rail and the pull-down node 264. This second storage stage 262 of the second multi-stage input driver 260 can further include the second storage node 265 at the junction between the additional PFET 262*a* and the additional NFET 262*b*. The gate of the additional PFET 262*a* can receive (i.e., can be controlled by) the second control signal (MCB) and the gate of the additional NFET 262*b* can receive (i.e., can be controlled by) the first stored bit signal (MT), which is received from the first feed forward path 230.

With this configuration, the second stored bit signal (QCS) will be internally generated on the second storage node 265 and this second stored bit signal (QCS) will be directly gated by the second control signal (MCB) and first stored bit signal (MT) and indirectly gated by the NFET 261*d*. That is, the logic state of the second stored bit signal (QCS) will vary as a function of the logic state of the second control signal (MCB), which is applied to the gate of the additional PFET 262*a*, the logic state of the first stored bit signal (MT), which is applied to the gate of the additional NFET 262*b*, and further as a function of the logic state of the clock signal (CLK), which is applied to the gate of the NFET 261*d* to enable/disable pulling down of the voltage level on the pull-down node 264 and thereby to enable/disable pulling down of the voltage level on the second storage node 265.

The secondary latch 250 can further include a second feed forward path 270 and a second feedback path 280. The second feed forward path 270 can be connected to the second storage node 265 such that the second stored bit signal (QCS) is transmitted along the second feed forward path 270 to both the second feedback path 280 and the digital output driver 290.

The second feedback path 280 can have second opposing ends connected to the second feed forward path 270 and can include a second inverter 281, which has an input node and a first intermediate node 283, and a second tri-state logic device 282, which has multiple input nodes and a second feedback node 284. Specifically, the second inverter 281 can receive the second stored bit signal (QCS) from the second feed forward path 270 at its' input node and, in response, can generate an inverted second stored bit signal (QTS) at its' second intermediate node 284. The second tri-state logic device 282 can include two PFETs (referred to herein as a distal or top PFET 282a and a proximal or center PFET 282b), which are connected in series between a positive voltage rail and the second feedback node 284, and two NFETs (referred to herein as a proximal or center NFET 282c and a distal or bottom NFET 282d), which are connected in series between the second feedback node 284 and ground. The second feedback node 284 can be at the junction between the two PFETs 282a-282b and the two NFETs 282c-282d. The gates of the distal PFET 282a and the distal NFET 282d can receive (i.e., can be controlled by) the inverted second stored bit signal (QTS) from the second inverter 281. The gate of the proximal PFET 282b can receive (i.e., can be controlled by) the single-phase clock signal (CLK) and the gate of the proximal NFET 282c can receive (i.e., can be controlled by) the second control signal (MCB) from the second control stage 261 of the second multi-stage input driver 260. It should be understood that in the discussion of the FETs within this second tri-state logic device 282, the terms "proximal" and "distal" are relative to the second feedback node 284.

The digital output driver 290 can include a third inverter. This third inverter can have an input node connected to the second feed forward path 270 and a digital output node. The third inverter can invert the second stored bit signal (QCS) and can output a digital output signal (Q), which will have a logic state that corresponds to the logic state of the first stored bit signal (MT) and, thereby to the logic state of the input signal (X) previously stored in the primary latch 210.

Operation of the FFs 200, 300, 500 can proceed as follows. In the DFF 200, an input signal (X) and, particularly, a data input signal (D) can be applied to the first control stage 221 of the first multi-stage input driver 220 of the primary latch 210. In the SFF 300, an input signal (X) and, particularly, a selected one of a data input signal (D) and a scan-in input signal (SI) can be applied to the first control stage 221 of the first multi-stage input driver 220 through the multiplexor 301. In the SFF 500, either the first multi-stage input driver 220A or the first multi-stage input driver 220B can be selectively enabled and the input signal (X) (e.g., a data input signal (D) when the first multi-stage input driver 220A is enabled or a scan-in input signal (SI) when the first multi-stage input driver 220B is enabled) can be applied to the first control stage 221 of the enabled input driver.

In the first control stage 221, if/when the clock signal (CLK) has the high logic state, the first control signal (INB) on the first control node 223 and the first stored bit signal (MT) (as previously stored) on the first storage node 225 will remain stable (i.e., will remain static or unchanged) regardless of fluctuations in the logic state of the input signal (X).

Specifically, when the clock signal (CLK) has the high logic state and the first control signal (INB) on the first control node 223 has the low logic state, the first stored bit signal (MT) on the first storage node 225 will have the high logic state. The PFET 221a in the first control stage 221 will be turned off, thereby preventing the voltage level on the pull-up node 224 from being pulled up and also preventing the voltage level on the first control node 223 from being pulled up and switching the logic state of the first control signal (INB) from the low logic state to the high logic state even if the input signal (X) varies. Furthermore, when the clock signal (CLK) has the high logic state and the first control signal (INB) on the first control node 223 also has the high logic state, the first stored bit signal (MT) on the first storage node 225 will have the low logic state. In this case, the NFET 221d will be turned off, thereby preventing the voltage level on the first control node 223 from being pulled down so that the logic state of the first control signal (INB) switches from the high logic state to the low logic state even if the input signal (X) varies. Thus, the first multi-stage input driver keeps the first control signal (INB) stable when the clock signal (CLK) has the high logic state, even when the logic state of the input signal (X) fluctuates.

The first feedback path 240 further ensures that the first stored bit signal (MT) remains stable when the clock signal (CLK) has the high logic state. For example, if the first control signal (INB) has the low logic state, the first stored bit signal (MT) will have the high logic state and the inverted first stored bit signal (MC) will have the low logic state. In this case, when the clock signal (CLK) is high, the two PFETs 242a-242b will both turn on, the proximal NFET 242c will also be on, but the distal NFET 242d will be off. As a result, the voltage level on the first feedback node 244 will be pulled up, thereby ensuring that the voltage level on the first feed forward path 230 remains high (i.e., ensuring that the first stored bit signal (MT) maintains the high logic state). Contrarily, if the first control signal (INB) has the high logic state, the first stored bit signal (MT) will have the low logic state and the inverted first stored bit signal (MC) will have the high logic state. In this case, when the clock signal (CLK) is high, the two PFETs 242a-242b will both be turned off, the proximal NFET 242c will be on and the distal NFET 242d will also be turned on. As a result, the voltage level on the first feedback node 244 will be pulled down, thereby ensuring that the voltage level on the first feed forward path 230 remains low (i.e., ensuring that the first stored bit signal (MT) maintains the low logic state).

When the clock signal (CLK) switches from the high logic state to the low logic state, the primary latch 210 will become transparent to that input signal (X) (i.e., the input signal (X) will be clocked into the primary latch 210). Specifically, when the clock signal (CLK) has the low logic state, within the first control stage 221 of the first multi-stage input driver 220 of the DFF 200 or the SFF 300 (or within the first control stage 221 of the enabled first multi-stage input driver 220A or 220B in the SFF 500), the PFET 221a will be turned on and the NFET 221c will turn off. In this case, if the input signal (X) has the low logic state, the PFET 221b will turn on so that the voltage level on the first control node 223 will be pulled up and so that the first control signal (INB) has the high logic state. Additionally, the NFET 221c and the pull-down transistor 221e will both be turned off, thereby preventing the voltage level on the first control node 223 from being pulled down. As a result of the first control signal (INB) with the high logic state, within the first storage stage 222, the additional PFET 222a turns off and the additional NFET 222b turns on, thereby pulling down the voltage level on the first storage node 225 such that the newly generated first stored bit signal (MT), like the input signal (X), has the low logic state. Furthermore, because the first control signal (INB) is high and the clock signal (CLK) is also low, both the proximal PFET 242b and the proximal NFET 242c of the first tri-state logic device 242 will be turned off such that first feedback node 244 will have a high impedance and will not impact the voltage level on the first feed forward path. However, if the input signal (X) has the high logic state, within the first control stage 221, the PFET 221b turns off, thereby preventing the voltage level on the first control node 223 from being pulled up. Additionally, the pull-down transistor 221e turns on so that the voltage level on the first control node 223 will be pulled down and so that the first control signal (INB) will have the low logic state. As a result of the first control signal (INB) with the low logic state, within the first storage stage 222, the additional PFET 222a turns on and the additional NFET 222b turns off, thereby pulling up the voltage level on the first storage node 225 such that the newly generated first stored bit signal (MT), like the input signal (X), has the high logic state. Furthermore, because the first stored bit signal (MT) is high, the inverted first stored bit signal (MC) will be low. When the inverted first control signal (MC) is low, the first control signal (INB) is low, and the clock signal (CLK) is also low, both the PFETs 242a-242b will be turned on and both the NFETs 242c-242d will be turned off such that first feedback node 244 will be pulled up, thereby keeping the voltage level on the first feed forward path high.

When the clock signal (CLK) switches back to the high logic state from the low logic state, within the primary latch 210, the first control signal (INB) and the first stored bit signal (MT) (as well as the inverted first stored bit signal (MC)) remain stable as discussed above. At this point in the operation, the secondary latch 250 becomes transparent. Specifically, when the clock signal (CLK) switches to the high logic state from the low logic state, within the second control stage 261 of the second multi-stage input driver 260 of the secondary latch 250, the PFET 261a will be on or off depending upon the logic state of the second feedback signal on the second feedback node 284, the PFET 261b will be turned off, the NFET 261c will be on or off depending upon the logic state of the inverted first stored bit signal (MC), the NFET 261d will be turned on, and the pull-up transistor 261e will be on or off depending upon the logic state of the inverted first bit signal (MC). Thus, when the clock signal (CLK) has the high logic state and the first stored bit signal (MT) has the high logic state such that the inverted first stored bit signal (MC) has the low logic state, the PFET 261b is turned off and the NFET 261c are both turned off and the pull-up transistor 261e is turned on such that the voltage level on the second control node 263 is pulled up and the second control signal (MCB) has the high logic state. As a result of the second control signal (MCB) with the high logic state and the first stored bit signal (MT) with the high logic state, within the second storage stage 262 of the second multi-stage input driver 260, the additional PFET 262a is turned off and the additional NFET 262b is turned on, thereby pulling down the voltage level on the second storage node 265 such that the newly generated second stored bit signal (QCS), like the inverted first stored bit signal (MC), has the low logic state. Furthermore, because the second stored bit signal (QCS) is low, the inverted second stored bit signal (QTS) will be high. When the inverted second stored bit signal (QTS) is high, the second control signal (MCB) is high, and the clock signal (CLK) is high, both the PFETs 282a-282b will be turned off and both the NFETs 282c-282d will be turned on such that second feedback node 284 will be pulled down, thereby keeping the voltage level on the second feed forward path low. However, when the clock signal (CLK) has the high logic state and the first stored bit signal (MT) has the low logic state such that the inverted first stored bit signal (MC) has the high logic state, then the PFET 261b and the pull-up transistor 261e will be turned off and the two NFETs 261c and 261d will be turned on such that the voltage level on the second control node 263 is pulled down and the second control signal (MCB) has the low logic state. As a result of the second control signal (MCB) with the low logic state and the first stored bit signal (MT) with the low logic state, within the second storage stage 262 of the second multi-stage input driver 260, the additional PFET 262a turns on and the additional NFET 262b turns off, thereby pulling up the voltage level on the second storage node 265 such that the newly generated second stored bit signal (QCS), like the inverted first stored bit signal (MC), has the high logic state. Furthermore, because the second control signal (MCB) is low and the clock signal (CLK) is high, both the proximal PFET 282b and the proximal NFET 282c of the second tri-state logic device 282 will be turned off such that second feedback node 284 will have a high impedance and will not impact the voltage level on the second feed forward path.

The third inverter of the digital output driver 290 can further receive the second stored bit signal (QCS) from the second feed forward path 270 and can invert that signal in order to output a digital output signal (Q), which will have a logic state that corresponds to the logic state of the current first stored bit signal (MT) and, thereby to the logic state of the input signal (X) stored in the primary latch 210.

If/when the clock signal (CLK) switches back to the low logic state, the second control signal (MCB) on the second control node 263 and the second stored bit signal (QCS) (as previously stored) on the second storage node 265 will remain stable (i.e., will remain static or unchanged) regardless of fluctuations in the logic state of the first stored bit signal (MT) and the inverted first stored bit signal (MC).

Specifically, in the second multi-stage input driver 260, when the clock signal (CLK) has the low logic state and the second control signal (MCB) on the second control node 263 has the low logic state, the second stored bit signal (QCS) on the second storage node 265 will have the high logic state and the inverted second storage signal (QTS) will have the low logic state. In this case, the two PFETs 282a-282b in the second tri-state logic device 282 will be turned on and the proximal NFET 282c will be turned off. Thus, the voltage level on the second feedback node 284 will be pulled up such that the PFET 261a in the second control stage 261 of the second multi-stage input driver 260, which is connected to the node 284, will be turned off, thereby preventing pulling up of the voltage level on the second control node (MCB) even though the PFET 261b was turned on by the low clock signal. Furthermore, when the clock signal (CLK) has the low logic state and the second control signal (MCB) on the second control node 263 has the high logic state, the second stored bit signal (QCS) on the second storage node 265 will have the low logic state. In this case, the NFET 261d in the second control stage 261 of the second multi-stage input driver 260 is turned off by the low clock signal, thereby preventing the voltage level on the second control node 263 from being pulled down (i.e., preventing the second control signal (MCB) from switching from the high logic state to the low logic state). Thus, the second multi-stage input driver 260 keeps the second control signal (MCB) stable when the clock signal (CLK) has the low logic state, even when the logic states of the first stored bit signal (MT) and the inverted first stored bit signal (MC) fluctuate.

The second feedback path 280 further ensures that the second stored bit signal (QCS) remains stable when the clock signal (CLK) has the low logic state. For example, if the second stored bit signal (QCS) has the low logic state, the second control signal (MCB) and the inverted second stored bit signal (QTS) will have the high logic state. In this case, when the clock signal (CLK) switches to the low logic state, the distal PFET 282a in the second tri-state logic device 282 is turned off, the proximal PFET 282b is turned on, and the two NFETs 282c-282d are also turned on. As a result, the voltage level on the second feedback node 284 will be pulled down, thereby ensuring that the voltage level on the second feed forward path 270 remains low (i.e., ensuring that the second stored bit signal (QCS) maintains the low logic state). Contrarily, if the second stored bit signal (QCS) has the high logic state, the second control signal (MCB) and the inverted second stored bit signal (QTS) will have the low logic state. In this case, when the clock signal (CLK) switches to the low logic state, the two PFETs 282a-282b in the second tri-state logic device 282 are turned on and the two NFETs 282c-282d are turned off. As a result, the voltage level on the second feedback node 284 will be pulled up, thereby ensuring that the voltage level on the second feed forward path 270 remains high (i.e., ensuring that the second stored bit signal (QCS) maintains the high logic state). Thus, the second feedback path 280 keeps the second stored bit signal (QCS) stable when the clock signal (CLK) has the low logic state, even when the logic states of the first stored bit signal (MT) and the inverted first stored bit signal (MC) fluctuate.

It should be noted that in order to further improve FF performance (e.g., switching speeds) the various FETs described above and incorporated into the FFs 200, 300, 500 could be super low threshold voltage (SLVT) FETs. Additionally, in the SFF 500, the clock transistors can optionally be shared between the parallel first multi-stage input drivers 220A and 220B to further improve performance. Furthermore, in the SFF 500, by incorporating the parallel first multi-stage input drivers 220A and 220B into the primary latch 210 to selectively and alternatively process either a data input signal (D) or a scan-in input signal (SI), performance can be improved (e.g., set up time can be decreased) as compared to the SFF 300 of FIG. 3, which employs a multiplexor 301 to select between the data input signal (D) and the scan-in input signal (SI).

Thus, disclosed above are various flip-flop (FF) embodiments. Each of the FFs includes a primary latch and a secondary latch. Each of these latches can include a multi-stage input driver, which internally generates a control signal based on the single-phase clock signal and an input signal and which further generates a stored bit signal based on the control signal. Additionally, each of these latches can include a feedback path with an inverter, which inverts the stored bit signal, and a tri-state logic device, which generates a feedback signal that is dependent on the inverted stored bit signal, the control signal and the single-phase clock signal. No inverted clock signal is employed. As a result of this configuration, each of the FFs is a fully digital, static, true single-phase clock (TSPC) flip-flop. By employing only a single-phase clock signal, the load on a clock tree of an integrated circuit (IC) that incorporates a large number of such FFs is significantly reduced and, thus, so is the dynamic power consumption of the IC. This reduction in dynamic power consumption occurs without significantly decreasing performance, increasing leakage power consumption, or increasing FF size.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A flip-flop comprising:
a primary latch; and
a secondary latch connected to the primary latch, wherein the primary latch and the secondary latch each comprise a multi-stage input driver and wherein each multi-stage input driver comprises:
 a control stage comprising:
  multiple transistors connected in series; and
  a control node at a junction between two transistors of the multiple transistors, wherein gates of the two transistors receive an input signal and a clock signal, respectively, such that logic states of first and second control signals at the control nodes of the primary and secondary latches, respectively, depend on the respective input signal and the clock signal; and
 a storage stage comprising:
  two additional transistors directly connected in series; and
  a storage node at a junction between the two additional transistors,
  wherein a gate of one of the two additional transistors of the storage stage of the secondary latch receives the second control signal such that a logic state of a stored bit signal at the storage node of the secondary latch depends on the second control signal; and
  wherein gates of the two additional transistors of the storage stage of the primary latch receive the first control signal such that a logic state of a stored bit signal at the storage node of the primary latch depends on the first control signal.

2. The flip-flop of claim 1,
wherein the primary latch and the secondary latch each further comprise:
 a feed forward path connected to the storage node; and
 a feedback path having opposing ends connected to the feed forward path and comprising:
  an inverter and a tri-state logic device connected in series between the opposing ends,
  wherein the tri-state logic device comprising a feedback node,
  wherein the inverter receives the stored bit signal and generates an inverted stored bit signal, and
  wherein a feedback signal generated at the feedback node is dependent on the inverted stored bit signal, one of the first and second control signals and the clock signal.

3. The flip-flop of claim 1, further comprising a digital output driver connected to the secondary latch.

4. The flip-flop of claim 1, wherein the input signal for the primary latch comprises a data input signal.

5. The flip-flop of claim 1, wherein the input signal for the primary latch comprises a selected one of a data input signal and a scan-in input signal.

6. The flip-flop of claim 2, wherein the input signal for the secondary latch comprises the inverted stored bit signal from the primary latch and wherein the stored bit signal for the secondary latch is gated by the stored bit signal for the primary latch and the second control signal of the secondary latch.

7. A flip-flop comprising:
a primary latch comprising:
a first multi-stage input driver comprising:
a first control stage comprising:
multiple first transistors connected in series; and
a first control node at a junction between two first transistors of the multiple first transistors, wherein gates of the two first transistors receive an input signal and a clock signal, respectively, such that a logic state of a first control signal at the first control node depends on the input signal and the clock signal; and
a first storage stage comprising:
two additional first transistors connected in series; and
a first storage node at a junction between the two additional first transistors, wherein gates of the two additional first transistors receive the first control signal such that a logic state of a first stored bit signal at the first storage node depends on the first control signal;
a first feed forward path connected to the first storage node; and
a first feedback path having first opposing ends connected to the first feed forward path and comprising: a first inverter comprising a first intermediate node and a first tri-state logic device comprising a first feedback node, wherein the first inverter receives the first stored bit signal and generates an inverted first stored bit signal at the first intermediate node, wherein the first tri-state logic device generates a first feedback signal at the first feedback node, and wherein the first feedback signal is dependent on the inverted first stored bit signal, the first control signal and the clock signal; and
a secondary latch connected to the primary latch.

8. The flip-flop of claim 7,
wherein the multiple first transistors of the first control stage comprise two p-type field effect transistors and two n-type field effect transistors connected in series between a positive voltage rail and ground,
wherein the first control node is at a junction between the two p-type field effect transistors and the two n-type field effect transistors,
wherein a pull-up node is at a junction between each of the two p-type field effect transistors,
wherein the first control stage further comprises a pull-down transistor connected in series between the first control node and ground,
wherein gates of the two p-type field effect transistors receive the clock signal and the input signal, respectively,
wherein gates of the two n-type field effect transistors receive the clock signal and the first stored bit signal, respectively,
wherein a gate of the pull-down transistor receives the input signal,
wherein the two additional first transistors of the first storage stage comprise: an additional p-type field effect transistor and an additional n-type field effect transistor connected in series between the pull-up node and ground,
wherein the first storage node is at a junction between the additional p-type field effect transistor and the additional n-type field effect transistor, and
wherein gates of the additional p-type field effect transistor and the additional n-type field effect transistor receive the first control signal.

9. The flip-flop of claim 8,
wherein, when the clock signal switches from a high logic state to a low logic state, the primary latch is transparent and within the first multi-stage input driver:
when the input signal has the low logic state, the pull-down transistor turns off and the two p-type field effect transistors turn on causing the first control signal on the first control node to have the high logic state, the additional p-type field effect transistor to turn off and the additional n-type field effect transistor to turn on such that the first stored bit signal on the first storage node has the low logic state, and
when the input signal has the high logic state, the pull-down transistor turns on causing the first control signal on the first control node to have the low logic state, the additional n-type field effect transistor to turn off and the additional p-type field effect transistor to turn on such that the first stored bit signal on the first storage node has the high logic state, and
wherein, when the clock signal switches from the low logic state to the high logic state, within the first multi-stage input driver, logic states of the first control signal and the first stored bit signal remain stable.

10. The flip-flop of claim 7, wherein the first tri-state logic device comprises:
two p-type field effect transistors connected in series between a positive voltage rail and the first feedback node; and
two n-type field effect transistors connected in series between the first feedback node and ground, wherein gates of one of the two p-type field effect transistors and one of the two n-type field effect transistors receive the inverted first stored bit signal, wherein a gate of another of the two p-type field effect transistors receives the first control signal, and wherein a gate of another of the two n-type field effect transistors receives the clock signal.

11. The flip-flop of claim 7, wherein the secondary latch comprises:
a second multi-stage input driver comprising:
a second control stage comprising:
multiple second transistors connected in series; and
a second control node at a junction between two second transistors of the multiple second transistors, wherein gates of the two second transistors receive the clock signal and the inverted first stored bit signal such that a second control signal at the second control node depends on the clock signal and the inverted first stored bit signal;

a second storage stage comprising:
  two additional second transistors connected in series; and
  a second storage node at a junction between the two additional second transistors, wherein gates of the two additional second transistors receive the second control signal and the first stored bit signal such that a logic state of a second stored bit signal at the second storage node depends on the second control signal and the first stored bit signal;
a second feed forward path connected to the second storage node; and
a second feedback path having second opposing ends connected to the second feed forward path and comprising: a second inverter comprising a second intermediate node and a second tri-state logic device comprising a second feedback node, wherein the second inverter receives the second stored bit signal and generates an inverted second stored bit signal at the second intermediate node, wherein the second tri-state logic device generates a second feedback signal at the second feedback node, and wherein the second feedback signal is dependent on the inverted second stored bit signal, the clock signal and the second control signal.

12. The flip-flop of claim 11,
wherein the multiple second transistors of the second control stage comprise two p-type field effect transistors and two n-type field effect transistors connected in series between a positive voltage rail and ground,
wherein the second control node is at a junction between the two p-type field effect transistors and the two n-type field effect transistors,
wherein a pull-down node is at a junction between each of the two n-type field effect transistors,
wherein the second control stage further comprises a pull-up transistor connected in series between the positive voltage rail and the second control node,
wherein gates of the two p-type field effect transistors receive the second feedback signal and the clock signal, respectively,
wherein gates of the two n-type field effect transistors receive the inverted first stored bit signal and the clock signal, respectively,
wherein a gate of the pull-up transistor receives the inverted first stored bit signal,
wherein the two additional second transistors of the second storage stage comprise: an additional p-type field effect transistor and an additional n-type field effect transistor connected in series between the positive voltage rail and the pull-down node,
wherein the second storage node is at a junction between the additional p-type field effect transistor and the additional n-type field effect transistor,
wherein a gate of the additional p-type field effect transistor receives the second control signal, and
wherein a gate of the additional n-type field effect transistor receives the first stored bit signal.

13. The flip-flop of claim 12,
wherein, when the clock signal switches from a low logic state to a high logic state, the secondary latch becomes transparent and within the second multi-stage input driver;
  when the first stored bit signal received by the second multi-stage input driver has the high logic state and the inverted first stored bit signal received by the second multi-stage input driver has the low logic state, the pull-up transistor turns on causing the second control signal on the second control node to have the high logic state, the additional p-type field effect transistor to turn off and the additional n-type field effect transistor to turn on such that the second stored bit signal on the second storage node has the low logic state, and
  when the first stored bit signal received by the second multi-stage input driver has the low logic state and the inverted first stored bit signal received by the second multi-stage input driver has the high logic state, the two n-type field effect transistors turned on causing the second control signal on the second control node to have the low logic state, the additional p-type field effect transistor to turn on, and the additional n-type field effect transistor to turn off such that the second stored bit signal on the second storage node has the high logic state, and
wherein within the second multi-stage input driver, when the clock signal switches from the high logic state to the low logic state, logic states of the second control signal and the second stored bit signal remain stable.

14. The flip-flop of claim 11, wherein the second tri-state logic device comprises:
  two p-type field effect transistors connected in series between a positive voltage rail and the second feedback node; and
  two n-type field effect transistors connected in series between the second feedback node and ground, wherein gates of one of the two p-type field effect transistors and one of the two n-type field effect transistors receive the inverted second stored bit signal, wherein a gate of another of the two p-type field effect transistors receives the clock signal, and wherein a gate of another of the two n-type field effect transistors receives the second control signal.

15. The flip-flop of claim 11, further comprising a digital output driver comprising a third inverter connected to the second feed forward path, wherein the third inverter receives and inverts the second stored bit signal and outputs a digital output signal.

16. A scan flip-flop comprising:
a primary latch comprising:
  a first multi-stage input driver comprising:
    a first control stage comprising:
      multiple first transistors connected in series; and
      a first control node at a junction between two first transistors of the multiple first transistors, wherein gates of the two first transistors receive an input signal and a clock signal, respectively, such that a logic state of a first control signal at the first control node depends on the input signal and the clock signal and wherein the input signal comprises a selected one of a data input signal and a scan-in input signal; and
    a first storage stage comprising:
      two additional first transistors connected in series; and
      a first storage node at a junction between the two additional first transistors, wherein gates of the two additional first transistors receive the first control signal such that a logic state of a first stored bit signal at the first storage node depends on the first control signal;
  a first feed forward path connected to the first storage node; and
  a first feedback path having first opposing ends connected to the first feed forward path and comprising:

a first inverter comprising a first intermediate node and a first tri-state logic device comprising a first feedback node, wherein the first inverter receives the first stored bit signal and generates an inverted first stored bit signal at the first intermediate node, wherein the first tri-state logic device generates a first feedback signal at the first feedback node, and wherein the first feedback signal is dependent on the inverted first stored bit signal, the first control signal and the clock signal; and a secondary latch connected to the primary latch.

17. The scan flip-flop of claim 16, wherein the first multi-stage input driver further comprises a multiplexor receiving the data input signal and the scan-in input signal and outputting a selected one of the data input signal and the scan-in input signal to gate the first control signal.

18. The scan flip-flop of claim 16, further comprising two first multi-stage input drivers connected in parallel to the first feed forward path, wherein the two first multi-stage input drivers receive that data input signal and the scan-in input signal, respectively, and wherein the two first multi-stage input drivers are selectively and alternatively operable for processing the data input signal and for processing the scan-in input signal, respectively.

19. The scan flip-flop of claim 16, wherein the first tri-state logic device comprises:
   two p-type field effect transistors connected in series between a positive voltage rail and the first feedback node; and
   two n-type field effect transistors connected in series between the first feedback node and ground, wherein gates of one of the two p-type field effect transistors and one of the two n-type field effect transistors receive the inverted first stored bit signal, wherein a gate of another of the two p-type field effect transistors receives the first control signal, and wherein a gate of another of the two n-type field effect transistors receives the clock signal.

20. The scan flip-flop of claim 16,
wherein the secondary latch comprises:
   a second multi-stage input driver comprising:
      a second control stage comprising:
         multiple second transistors connected in series; and
         a second control node at a junction between two second transistors of the multiple second transistors, wherein gates of the two second transistors receive the clock signal and the inverted first stored bit signal such that a second control signal at the second control node depends on the clock signal and the inverted first stored bit signal; and
      a second storage stage comprising:
         two additional second transistors connected in series; and
         a second storage node at a junction between the two additional second transistors, wherein gates of the two additional second transistors receive the second control signal and the first stored bit signal such that a logic state of a second stored bit signal at the second storage node depends on the second control signal and the first stored bit signal;
   a second feed forward path connected to the second storage node; and
   a second feedback path having second opposing ends connected to the second feed forward path and comprising: a second inverter comprising a second intermediate node and a second tri-state logic device comprising a second feedback node, wherein the second inverter receives the second stored bit signal and generates an inverted second stored bit signal at the second intermediate node, wherein the second tri-state logic device generates a second feedback signal at the second feedback node, and wherein the second feedback signal is dependent on the inverted second stored bit signal, the clock signal and the second control signal, wherein the scan flip-flop further comprises a digital output driver comprising a third inverter connected to the second feed forward path, wherein the third inverter receives and inverts the second stored bit signal and outputs a digital output signal, and wherein the second tri-state logic device comprises:
   two p-type field effect transistors connected in series between a positive voltage rail and the second feedback node; and
   two n-type field effect transistors connected in series between the second feedback node and ground, wherein gates of one of the two p-type field effect transistors and one of the two n-type field effect transistors receive the inverted second stored bit signal, wherein a gate of another of the two p-type field effect transistors receives the clock signal, and wherein a gate of another of the two n-type field effect transistors receives the second control signal.

21. A flip-flop comprising:
a primary latch; and
a secondary latch connected to the primary latch, wherein the primary latch and the secondary latch each comprise a multi-stage input driver and wherein each multi-stage input driver comprises:
   a control stage comprising:
      multiple transistors connected in series; and
      a control node at a junction between two transistors of the multiple transistors, wherein gates of the two transistors receive an input signal and a clock signal, respectively, such that a logic state of a control signal at the control node depends on the input signal and the clock signal; and
   a storage stage comprising:
      two additional transistors connected in series; and
      a storage node at a junction between the two additional transistors,
   wherein a gate of at least one of the two additional transistors receives the control signal such that a logic state of a stored bit signal at the storage node depends on the control signal;
wherein the primary latch and the secondary latch each further comprise:
   a feed forward path connected to the storage node; and
   a feedback path having opposing ends connected to the feed forward path and comprising:
   an inverter and a tri-state logic device connected in series between the opposing ends,
   wherein the tri-state logic device comprising a feedback node,
   wherein the inverter receives the stored bit signal and generates an inverted stored bit signal, and
   wherein a feedback signal generated at the feedback node is dependent on the inverted stored bit signal, the control signal and the clock signal.

* * * * *